US006594262B1

United States Patent
Kwon et al.

(10) Patent No.: US 6,594,262 B1
(45) Date of Patent: Jul. 15, 2003

(54) APPARATUS AND METHOD FOR PROTECTING ATM HEADER FROM THE BURST ERROR

(75) Inventors: O Hyung Kwon, Daejeon (KR); Jong Seok Chae, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 09/136,479

(22) Filed: Aug. 19, 1998

(30) Foreign Application Priority Data

Nov. 28, 1997 (KR) ........................... 1997-64083

(51) Int. Cl.[7] ..................... H04L 12/56; H03M 13/00
(52) U.S. Cl. ................. 370/395.1; 370/389; 714/746
(58) Field of Search ............... 370/395.1, 395.6, 370/395.7, 465, 467, 471, 472, 474, 506, 535, 242, 244, 250, 289, 392; 714/746, 752, 758, 774, 775–776, 781, 784, 798

(56) References Cited

U.S. PATENT DOCUMENTS

| | | | |
|---|---|---|---|
| 5,600,653 A | | 2/1997 | Chitre et al. |
| 5,699,369 A | * | 12/1997 | Guha ........................... 371/41 |
| 5,754,941 A | * | 5/1998 | Sharpe et al. ................ 455/5.1 |
| 5,886,989 A | * | 3/1999 | Evans et al. ................ 370/347 |
| 5,930,251 A | * | 7/1999 | Murakami et al. .......... 370/395 |
| 6,028,933 A | * | 2/2000 | Heer et al. ..................... 380/9 |
| 6,041,051 A | * | 3/2000 | Doshi et al. ................ 370/352 |
| 6,118,777 A | * | 9/2000 | Sylvain ....................... 370/351 |
| 6,151,312 A | * | 11/2000 | Evans et al. ................ 370/338 |

OTHER PUBLICATIONS

J Lunsford et al., "Link Enhancement for ATM over Satellite Links", COMSAT Corporation, USA, pp. 129–136.

* cited by examiner

*Primary Examiner*—Alpus H. Hsu
*Assistant Examiner*—Toan Nguyen
(74) *Attorney, Agent, or Firm*—Jacobson Holman PLLC

(57) ABSTRACT

The present invention relates to an apparatus and a method which protect the header of an synchronous transfer mode (ATM) cell from the burst error by using reed solomon RS error correcting code in order to compensate the loss of the ATM cell on the link of the ATM cell and prevent the increasement of the overhead by applying a header error correction HEC bite to a forward error correction code FEC.

A method of the present invention for protecting an ATM header on an encoding channel of which noise has the burst error characteristics includes the first step of initializing the counter value of an ATM cell; the second step of dividing an ATM header and an ATM payload from the inputted ATM cell, and of encoding an error correction code by comparing the counter value of the ATM cell with the counter value of a physical layer convergence protocol frame after abandoning the ATM cell or correcting the ATM header according to the number of errors of the ATM header by using the header error correction HEC bite; and the third step of reordering the ATM header and the ATM payload, and of outputting the reordered physical layer convergence protocol frame.

The present invention is used for system for protecting an ATM header.

12 Claims, 5 Drawing Sheets

| 8 | 7 | 6 | 5 | 4 | 3 | 2 | 1 | |
|---|---|---|---|---|---|---|---|---|
| VIRTUAL PATH IDENTIFIER(VPI) ||||||||  1 |
| VIRTUAL PATH IDENTIFIER(VPI) |||| VIRTUAL CHANNEL IDENTIFIER(VCI) |||| 2 |
| VIRTUAL CHANNEL IDENTIFIER(VCI) |||||||| 3 |
| VIRTUAL CHANNEL IDENTIFIER(VCI) |||| PAYLOAD TYPE IDENTIFIER(PIT) ||| CELL LOSS PRIORITY (CLP) | 4 |
| HEADER ERROR CORRETIAN (HEC) |||||||| 5 |
| |||||||| 6 |
| |||||||| 7 |

| PLCP FRAME | | PATH OVERHEAD INDICATOR | PATH OVERHEAD | PLCP PAYLOAD | | | | | TRAILER |
|---|---|---|---|---|---|---|---|---|---|
| A1 | A2 | P11 | Z8 | VPI | VCI | RTI & CLP | HEC | FIRST ATM PAYLOAD | |
| A1 | A2 | P10 | Z5 | VPI | VCI | RTI & CLP | HEC | ATM PAYLOAD | |
| A1 | A2 | P09 | Z4 | VPI | VCI | RTI & CLP | HEC | ATM PAYLOAD | |
| A1 | A2 | P08 | Z3 | VPI | VCI | RTI & CLP | HEC | ATM PAYLOAD | |
| A1 | A2 | P07 | Z2 | VPI | VCI | RTI & CLP | HEC | ATM PAYLOAD | |
| A1 | A2 | P06 | Z1 | VPI | VCI | RTI & CLP | HEC | ATM PAYLOAD | |
| A1 | A2 | P05 | X | VPI | VCI | RTI & CLP | HEC | ATM PAYLOAD | |
| A1 | A2 | P04 | B1 | VPI | VCI | RTI & CLP | HEC | ATM PAYLOAD | |
| A1 | A2 | P03 | G1 | VPI | VCI | RTI & CLP | HEC | ATM PAYLOAD | |
| A1 | A2 | P02 | X | VPI | VCI | RTI & CLP | HEC | ATM PAYLOAD | |
| A1 | A2 | P01 | X | VPI | VCI | RTI & CLP | HEC | ATM PAYLOAD | |
| A1 | A2 | P00 | C1 | VPI | VCI | RTI & CLP | HEC | TWELVETH ATM PAYLOAD | 13 or 14 NIDDLES |
| 1BITE | 1BITE | 1BITE | 1BITE | 1.5BITE | 2BITES | 0.5BITE | 1BITE | 48BITES | |

APPARATUS AND METHOD FOR PROTECTING ATM HEADER FROM THE BURST ERROR

BACKGROUND OF THE INVENTION

1. Field of the Invention

The present invention relates to an apparatus and a method which protect the header of an asynchronous transfer mode (ATM) cell from the burst error by using reed-solomon RS error correcting code in order to compensate the loss of the ATM cell on the link of the ATM cell and prevent the increase of the overhead by applying a header error correction HEC bit to a forward error correction code FEC.

2. Description of the Prior Art

In the priority art, the conventional methods protecting the header of an ATM cell are classified according to the following two types: firstly, a method using the Interleaver/Deinterleaver technique and, secondly, another method using the FEC technique.

The method using the Interleaver/Deinterleaver technique generates random errors by applying the Interleaver/Deinterleaver technique to an ATM header and distributing the burst errors, and corrects one bit; error generating among ATM headers of five bits. However, this method requires many memories in order to process the burst errors generating the ATM header and has a problem that the processing time is delayed.

On the other hand, the method of using the FEC technique of the conventional art further requires an overhead bit and has a problem reducing the frequency use efficiency.

SUMMARY OF THE INVENTION

In order to settle the problems, it is an object of the present invention to provide an apparatus and a method for protecting the ATM header on a channel, of which noise has the burst error characteristics, by using reed-solomon (RS) error correction code without changing the structure of the conventional ATM cell.

The apparatus of the present invention includes an ATM exchanger for generating an ATM cell; an encoder for dividing the ATM cell into an ATM header and an ATM payload by deframing and reverse-multiplexing the ATM cell, and for encoding the overhead bit of the ATM header by using a RS error correction code without changing the structure of a conventional ATM cell for multiplexing the ATM header by inserting it into a header error correction bit; a modulator for framing the ATM header and the ATM payload, which are inputted from the encoder, in type of the physical layer convergence protocol and for modulating them; a demodulator for demodulating the modulated data of the modulator; and a decoder for dividing the ATM cell into the ATM header and the ATM payload by reverse-multiplexing it by deframing the demodulated data of the demodulator in type of the physical layer convergence protocol, and for decoding and correcting the burst error generated in the ATM header in order to multiplex the reordered ATM header and transmit it to the ATM exchanger.

The method of the present invention for protecting an ATM header on an encoding channel of which noise has the burst error characteristics comprises the first step of initializing the counter value of an ATM cell; the second step of dividing an ATM header and an ATM payload from the inputted ATM cell, and of encoding an error correction code by comparing the counter value of the ATM cell with the counter value of a physical layer convergence protocol frame after abandoning the ATM cell or correcting the ATM header according to the number of errors of the ATM header by using the header error correction HEC bite; and the third step of reordering the ATM header and the ATM payload and of outputting the reordered physical layer convergence protocol frame.

Also, the mode for protecting an ATM header on a decoding channel of which noise has the burst error characteristics comprises the first step of initializing the counter value of an ATM cell; the second step of dividing an ATM header and an ATM payload from the inputted ATM cell, and of correcting the generated error by comparing the counter value of the ATM cell with the counter value of a physical layer convergence protocol frame and decoding an error correction code after buffering the ATM header; and the third step of generating a header error correction bite by reordering the ATM header and the ATM payload and of outputting the reordered ATM cell in type of the reordered physical layer convergence protocol frame.

BRIEF DESCRIPTION OF THE DRAWING

Still other advantages and features of the present invention will become apparent when the following detailed description is read in conjunction with the attached drawings, in which:

FIG. 2 illustrates a diagram showing one example of a physical layer convergence protocol used for the present invention;

DETAILED DESCRIPTION OF THE PREFERRED EMBODIMENT

Figure 1:
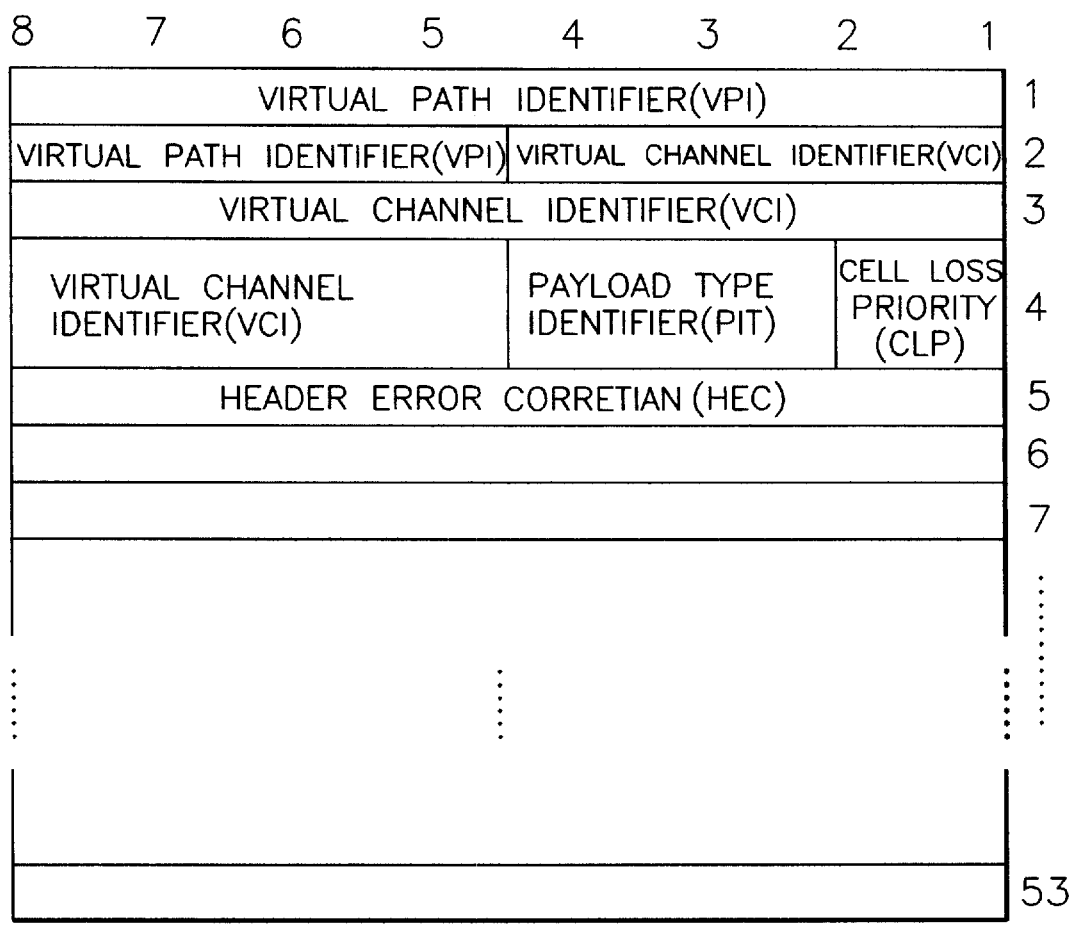
FIG. 1 illustrates a diagram showing one example of an ATM cell used for the present invention.

FIG. 1 illustrates a diagram showing one example of an ATM cell used for the present invention.

The ATM cell comprises ATM headers of five bits and ATM payloads of forty-eight bits. The ATM header comprises a virtual path identifier VPI, a virtual channel identifier VCI, an ATM payload type identifier PTI, a cell loss priority CLP and a header error correction HEC.

FIG. 2 illustrates a diagram showing one example of a physical layer convergence protocol used for the present invention.

The physical layer convergence protocol PLCP comprises PLCP frames of two bits as A1 and A2, path overhead indicator POI of one bit, path overhead POH of one bit, PLCP payloads of fifty-three bits mapping the ATM cell in FIG. 1 and thirteen or fourteen trailer nibbles for synchronization after the twelfth PLCP payload.

Figure 3:
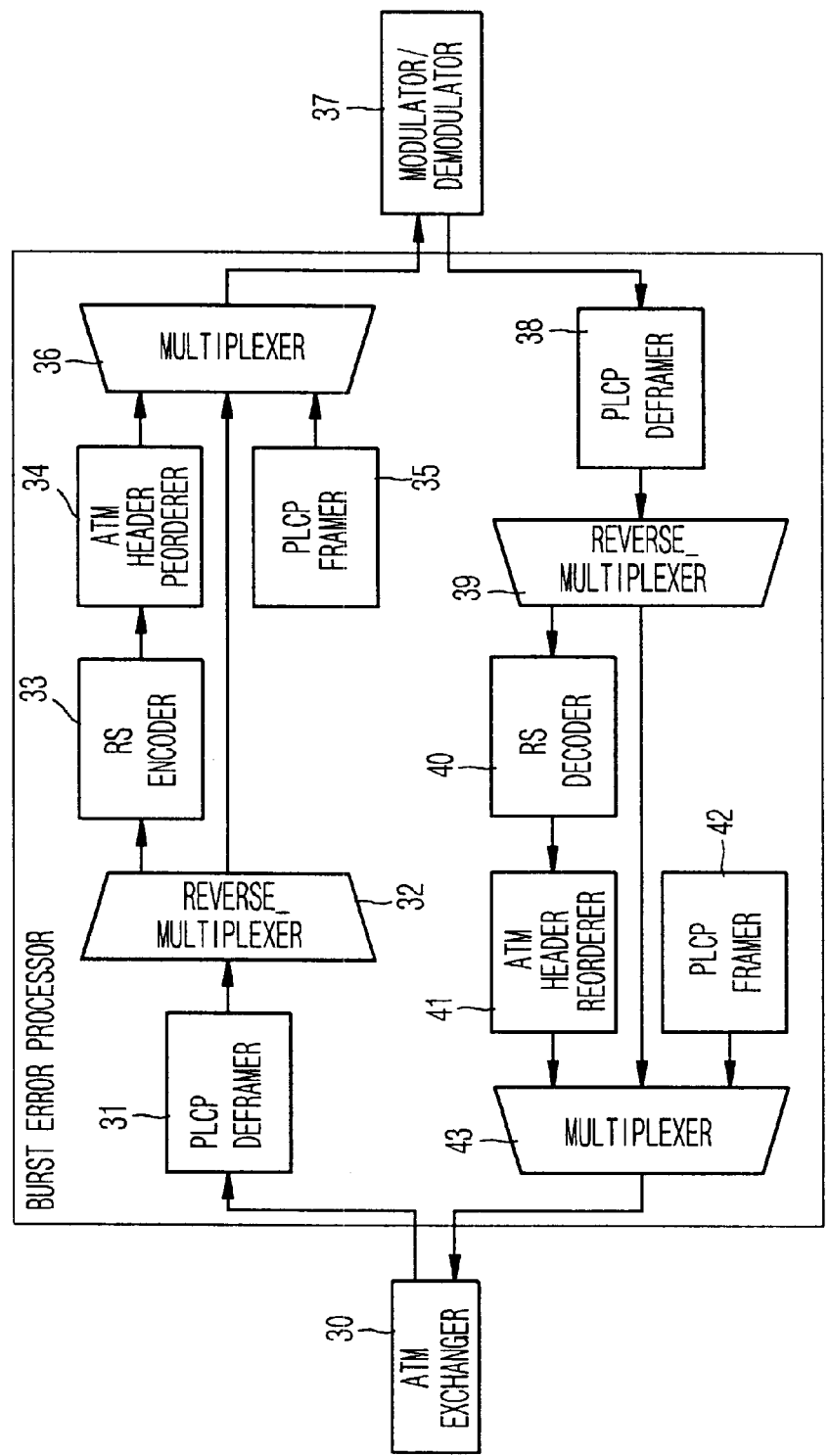
FIG. 3 illustrates a block diagram showing a burst error processing apparatus according to the present invention.

FIG. 3 illustrates a block diagram showing a burst error processing apparatus according to the present invention.

The burst error processing apparatus in accordance with an preferable embodiment of the present invention divides an ATM header and an ATM payload from an inputted ATM cell, encodes and decodes the ATM header by using reed-solomon error correction codes in order to protect the head of the ATM cell from the burst error.

Firstly, an encoder using a RS error correction code is operated as follows:

If an ATM cell received from an ATM exchanger 30 to a PLCP frame is inputted, a physical layer convergence protocol PLCP deframer 31 conducts a PLCP header and a trailer and transmits them to a reverse-multiplexer 32.

The reverse-multiplexer 32 divides the header and the trailer received from the PLCP deframer 31 into an ATM header and an ATM payload. At this time, four bits except a HEC bit among ATM headers of five bits are transmitted a reed-solomon RS encoder 33 and the ATM payload is transmitted to a multiplexer 36.

The RS encoder 33 generates a forward error correction code FEC for the ATM headers of four bits except the HEC bit. This process is performed in case of one PLCP frame. That is, if forty-eight header bits are installed as input for twelve ATM headers, twelve overhead bits are generated and the total sixty bits are transmitted to an ATM head reorderer 34. At this time, the shortened reed-solomon encoders are used as the error correction codes.

The ATM head reorderer 34 transmits to the multiplexer 36 the overheads of twelve bits added newly among sixty bits inputted from the reed-solomon encoder 33 as they are inserted into the HEC bit of the ATM header one bit by one bit.

The PLCP framer 35 performs the function generating the PLCP frame again for synchronization before a forward error corrected ATM cell is transmitted to a modulator 37.

The multiplexer 36 switches the ATM cell before transmitting it to the modulator/demodulator 37 and transmits the ATM header and the ATM payload received from the ATM head reorderer 34 and the reverse-multiplexer 32. At this time, the multiplexer 36 switches the twelfth ATM payload and then switches the PLCP trailer received from a PLCP framer 35.

Secondly, a decoding apparatus using a RS error correction code is operated as follows:

A physical layer convergence protocol PLCP deframer 38 receives a PLCP frame from a modulator/demodulator 37, synchronizes an ATM signal and transmits only an ATM cell to a reverse-multiplexer 39.

The reverse-multiplexer 39 reverse-multiplexes the ATM cell received from the PLCP deframer 38 and transmits ATM headers of five bits to RS decoder 40.

The RS encoder 33 corrects the burst error generated at the ATM header by decoding sixty bits received from the reverse-multiplexer 39 and transmits the corrected ATM header to an ATM head reorderer 41.

The ATM head reorderer 41 reorders the corrected ATM header inputted from RS decoder 40 and transmits them to a multiplexer 43.

The PLCP framer 42 generates the PLCP frame again for synchronization before transmitting the ATM cell to an ATM exchanger 30.

The multiplexer 43 receives a PLCP header and a trailer from the PLCP framer 42, switches the ATM cell received from the ATM head reorderer 41 and the ATM cell payload received from the reverse-multiplexer 39, and transmits them to the ATM exchanger 30.

Figure 4:
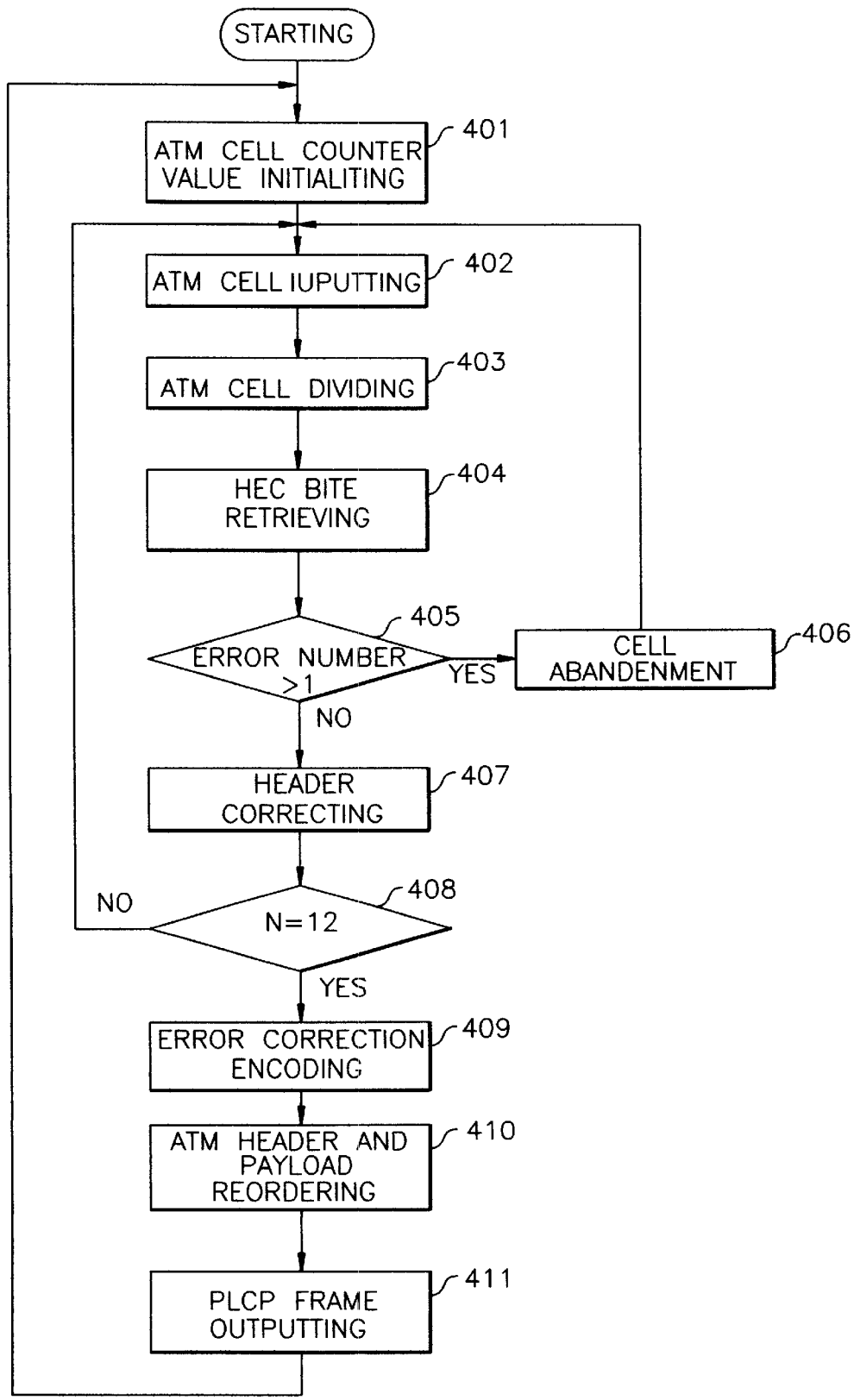
FIG. 4 illustrates a flow chart showing the encoding procedure of a burst error processing apparatus according to the present invention.

FIG. 4 illustrates a flow chart showing the encoding procedure of a burst error processing apparatus according to the present invention.

Firstly, a reverse-multiplexer 32 sets an ATM cell counter value N as zero in order to divide an ATM cell received in type of a PLCP frame. At this time, the N value includes twelve ATM cells per one PLCP frame and is used for the operation control of a loop.

On the other hand, if the initiating procedure is completed, the reverse-multiflexer 32 receives the ATM cell, stores it in a buffer, and increases the N value of one 402.

Then, the reverse-multiplexer divides the inputted ATM cell into an ATM header and an ATM payload 403. After retrieving a HEC bit 404, it discriminates the number of errors of the ATM header.by using the retrieved HEC bit 405. If the errors generated in the ATM header are two or more, it instructs abandonment of a cell 406 and inputs a new ATM cell 402. At this time, the N value is not increased. However, if the error generated in the ATM header is one, it correct the ATM header 407 and discriminates whether the N value is twelve 408. As the result of the discrimination, it receives a new ATM cell if the N is not twelve 403. On the contrary, if the N is twelve, a RS encoder encodes the RS 409.

Then, a multiplexer 36 inputs the ATM head reordered by the ATM head reorderer 34 and reorders the header of the ATM cell 410. At this time, an overhead bit generated when encoding a HEC bit in the RS encoder 33 is inserted into the position of the HEC bit in the PLCP frame structure.

Finally, the multiplexer 36 outputs the reordered PLCP frame to a modulator/demodulator 37 411 and is feedbacked again to the procedure performing the initializing procedure 401.

Figure 5:
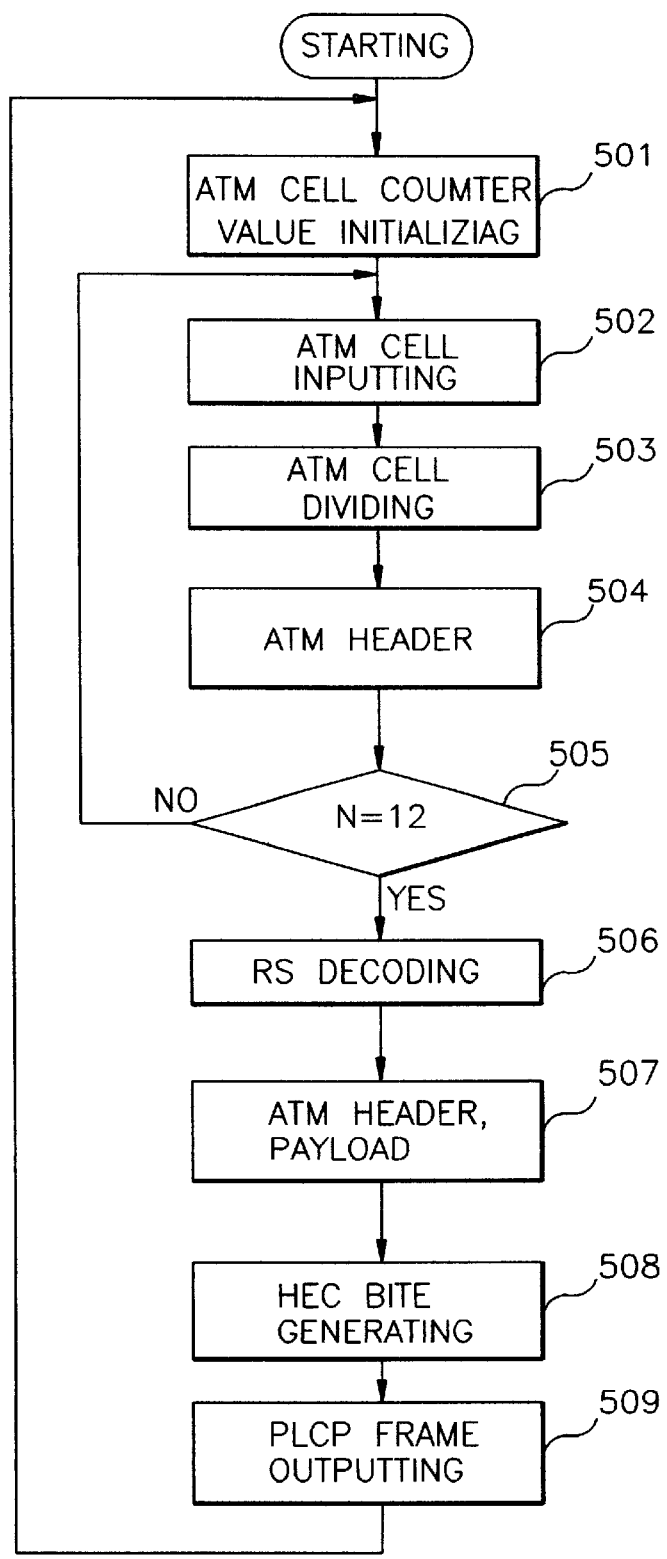
FIG. 5 illustrates a flow chart showing the decoding procedure of a burst error processing apparatus according to the present invention.

FIG. 5 illustrates a flow chart showing the decoding procedure of a burst error processing apparatus according to the present invention.

Firstly, a reverse-multiplexer 39 sets the count value N of an ATM cell to zero in order to divide the ATM cell received from a demodulator 37 into an ATM header and an ATM payload 501. At this time, the N value includes twelve ATM cells per one PLCP frame and is used for operation control of a loop.

On the other hand, if the initiating procedure is completed, the reverse-multiplexer 39 receives the ATM cell 502 and divided them into an ATM cell and an ATM payload 503. After buffering the ATM header 504, it discriminates whether the N is twelve 505, in other words, whether twelve ATM cells are received 505. As the result of discrimination, if the N value is not twelve, it increases the N value of one and inputs a new ATM cell 502. On the contrary, if the N value is twelve, a RS encoder 33 decodes a RS and correct the error 506.

Then, a multiplexer 43 relocates the ATM header and the ATM payload 507. However, if the generated error passes over the capability of the RS decoder 40, it informs the twelve ATM cells are damaged.

Finally, the multiplexer 43 generates a HEC bite 508, outputs the reordered ATM cell in type of PLCP frame 509 and is feedbacked again to the procedure performing the initializing procedure 501.

As being described in the above, the present invention has a performance similar to a ground optical fiber network because it minimizes loss of cell generated owing to the burst error of an ATM cell header by using RS error correction code, raises the efficiency of transmission by inserting an overhead bit, which is generated when encoding a forward error correction code, to an HEC bit without changing the structure of a conventional ATM cell, shortens the ATM signal processing time, and reduces memory space.

While the preferred embodiments have been described in the foregoing specification, the scope of the invention shall be defined with reference to the following claims.

What is claimed is:

1. An apparatus for protecting an asynchronous transfer mode (ATM) header from burst error comprising:

an ATM exchanger for generating an ATM cell;

an encoder for dividing said ATM cell into an ATM header and a ATM payload by deframing and reverse-multiplexing said ATM cell and for encoding an overhead bit of said ATM header by using a reed-solomon (RS) error correction code without changing the structure of an ATM cell for multiplexing said ATM header by applying said ATM header into a header error correction bit;

a modulator for framing said ATM header and said ATM payload which are inputted from said encoder according to physical layer convergence protocol and for modulating said ATM header and said ATM payload;

a demodulator for demodulating modulated data of said a modulator; and a decoder for dividing said ATM cell into said ATM header and said ATM payload by reverse-multiplexing said ATM cell by deframing the demodulated data of the demodulator according to the physical layer convergence protocol, and for decoding and correcting the burst error generated in said ATM header in order to multiplex and transmit the ATM header to said ATM exchanger.

2. An apparatus for protecting an ATM header from burst error according to claim 1, wherein said encoder comprising:

a first deframer for conducting a physical layer convergence protocol (PLCP) header and a trailer of an ATM cell inputted from said ATM exchanger;

a reverse-multiplexer for reverse-multiplexing output data of said first deframer and for dividing the output data into an ATM header and an ATM payload;

an overhead bit generator for generating an overhead bit from remaining bits except a header error correction (HEC) bit among ATM headers inputted from said first reverse-multiplexer;

a first head reorderer for reordering the ATM header by inserting said overhead bit, which is inputted from said overhead bit generator, into an error correction bit;

a first framer for initializing a forward error corrected ATM cell; and a multiplexer for switching the PLCP header, the ATM header and the ATM payload inputted from said first header reorderer and said first reverse-multiplexer, and the PLCP trailer inputted from the first framer, for multiplexing them and for transmitting them to said modulator.

3. An apparatus for protecting an ATM header from a burst error according to claim 1, wherein said decoder comprising:

a second deframer for initializing the PLCP frame inputted from said demodulator and for outputting only the ATM cell;

a second reverse-multiplexer for reverse-multiplexing the ATM cell of said second deframer and for dividing the ATM cell into an ATM header and an ATM payload;

a header output device for decoding the output data of said second deframer and said second reverse-multiplexer, for correcting the burst error in the ATM header and for outputting the ATM header;

a second head reorderer for reordering the ATM header inputted from said header output device;

a second framer for initializing the forward error corrected ATM cell; and a second multiplexer for switching the PLCP header and the trailer inputted from said second framer, the ATM cell inputted from said second header reorderer, and the ATM payload inputted from said second reverse-multiplexer, for multiplexing them and for transmitting them to said ATM exchanger.

4. An apparatus for protecting an ATM header from a burst error according to claim 3, wherein said encoder comprising a reed-solomon encoder for generating a forward error correction code (FEC) for the ATM headers of four bits except the header error correction (HEC) bit.

5. A method for protecting an ATM header on an encoding channel of which noise has the burst error characteristics, comprising steps of:

(a) initializing a counter value of an ATM cell;

(b) dividing the ATM cell into an ATM header and an ATM payload and encoding an error correction code by comparing the counter value of the ATM cell with a counter value of a physical layer convergence protocol frame after abandoning the ATM cell or correcting the ATM header according to the number of errors of the ATM header by using a header error correction HEC bit; and (c) reordering the ATM header and the ATM payload and outputting the reordered physical layer convergence protocol frame.

6. The method according to claim 5, wherein the step (b) comprises steps of:

(b-1) receiving the ATM cell, storing the ATM cell in a buffer and increasing the counter value of the ATM cell by one;

(b-2) discriminating whether the number of errors of the ATM header is one and over by using a retrieved HEC bit;

(b-3) instructing abandonment of a cell and receiving a new ATM cell if the errors generated in the ATM header are two or more;

(b-4) correcting the ATM header and discriminating whether the ATM cell counter value is an appointed value if the error generated in the ATM header is an appointed value;

(b-5) receiving a new ATM cell if the ATM cell counter value is not an appointed value; and (b-6) encoding an error correction code if the ATM cell counter value is an appointed value.

7. The method according to claim 5, wherein said step (c) comprises:

(c-1) reordering a path overhead (POH) according to the physical layer convergence protocol and the header of an ATM cell; and (c-2) outputting the reordered physical layer convergence protocol frame.

8. The method according to claim 6, wherein said appointed value of said step (b-4) is ATM cells of twelve.

9. A method for protecting an ATM header on a decoding channel of which noise has burst error characteristics, comprising steps of:

(a) initializing a counter value of an ATM cell;

(b) dividing said ATM cell into an ATM header and an ATM payload and correcting generated error by comparing the counter value of the ATM cell with a counter value of a physical layer convergence protocol frame and decoding an error correction code after buffering the ATM header; and (c) generating a header error correction bit by reordering the ATM header and the ATM payload, and outputting the reordered ATM cell according to the reordered physical layer convergence protocol frame.

10. The method according to claim 9, wherein the step (b) comprises steps of:
   (b-1) receiving the ATM cell, storing the ATM cell in a buffer and increasing the counter-value of the ATM cell by one;
   (b-2) discriminating whether the ATM cell counter value is an appointed value after buffering the ATM header;
   (b-3) receiving a new ATM cell if the ATM cell counter value is not an appointed value; and
   (b-4) encoding an error correction code if the ATM cell counter value is an appointed value.

11. A method according to claim 9, wherein said step (c) comprises steps of:
   (c-1) reordering the ATM header and the ATM payload;
   (c-2) generating a header error correction (HEC) bit in the ATM cell; and
   (c-3) outputting the reordered cell as the physical layer convergence protocol frame and receiving a new ATM cell after performing the initializing procedure.

12. The method according to claim 10, wherein said appointed value of said step (b-2) is twelve ATM cells.

* * * * *